United States Patent
Sawashi

(10) Patent No.: US 7,439,786 B2
(45) Date of Patent: Oct. 21, 2008

(54) POWER AMPLIFICATION CIRCUITS

(75) Inventor: Tokihiko Sawashi, Tokyo (JP)

(73) Assignee: Sony Corporation (JP)

( * ) Notice: Subject to any disclaimer, the term of this patent is extended or adjusted under 35 U.S.C. 154(b) by 380 days.

(21) Appl. No.: 10/985,120

(22) Filed: Nov. 10, 2004

(65) Prior Publication Data

US 2005/0116771 A1 Jun. 2, 2005

(30) Foreign Application Priority Data

Nov. 10, 2003 (JP) .............................. 2003-379394

(51) Int. Cl.
*H03K 3/017* (2006.01)
(52) U.S. Cl. ..................................... 327/172
(58) Field of Classification Search ................... 330/10, 330/251, 297, 207 A, 250; 327/172–176
See application file for complete search history.

(56) References Cited

U.S. PATENT DOCUMENTS

| | | | |
|---|---|---|---|
| 4,415,862 A | | 11/1983 | Kunugi |
| 6,104,248 A | * | 8/2000 | Carver ........................ 330/297 |
| 6,593,806 B1 | * | 7/2003 | Melanson .................... 330/10 |
| 6,788,137 B2 | * | 9/2004 | Morita ........................ 330/10 |
| 6,812,785 B2 | * | 11/2004 | Masuda et al. ................ 330/10 |
| 2001/0026174 A1 | | 10/2001 | Delano |
| 2002/0075069 A1 | | 6/2002 | Karki et al. |
| 2003/0087621 A1 | | 5/2003 | Roeckner et al. |
| 2003/0112064 A1 | * | 6/2003 | Masuda et al. ................ 330/10 |
| 2003/0169103 A1 | * | 9/2003 | Shima ......................... 330/10 |

FOREIGN PATENT DOCUMENTS

JP 2002-158544 A 5/2002

\* cited by examiner

*Primary Examiner*—My-Trang Nu Ton
(74) *Attorney, Agent, or Firm*—Lerner, David, Littenberg, Krumholz & Mentlik, LLP

(57) ABSTRACT

A power amplification circuit includes first and second clock signal generating portions operable to produce, respectively, first and second clock signals different in frequency from each other; first and second PWM signal generating portions operable to produce first and second PWM signals based on first and second input signals using the first and second clock signals, respectively; a first switching amplifier operable to perform a switching operation in response to the first PWM signal to subject the first PWM signal to power amplification to produce a first output signal and to supply the first output signal to a first circuit load; and a second switching amplifier operable to perform a switching operation in response to the second PWM signal to subject the second PWM signal to power amplification to produce a second output signal and to supply the second output signal to a second circuit load.

6 Claims, 4 Drawing Sheets

FIG. 2A    PLP
FIG. 2B    PLN
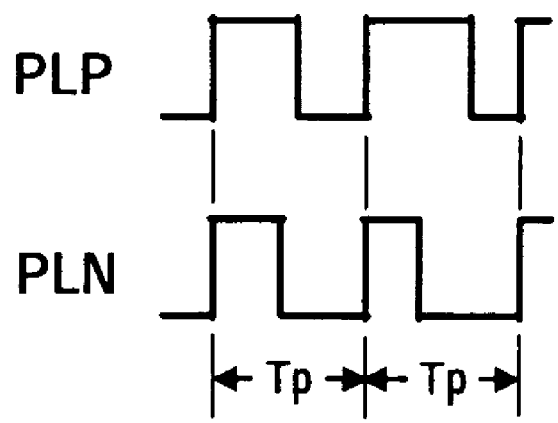
FIG. 2C    PRP
FIG. 2D    PRN
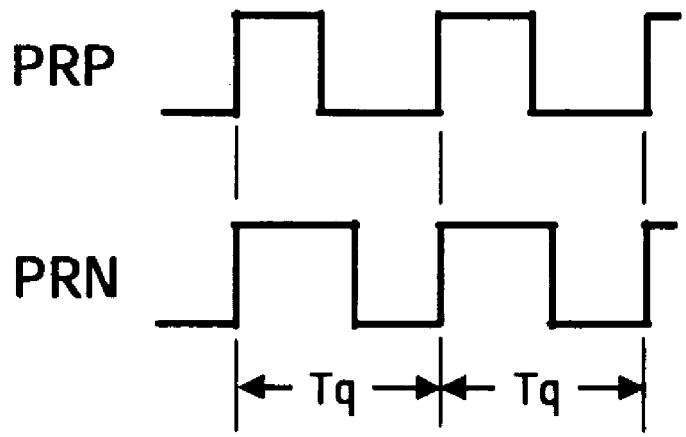

FIG. 3A OLP 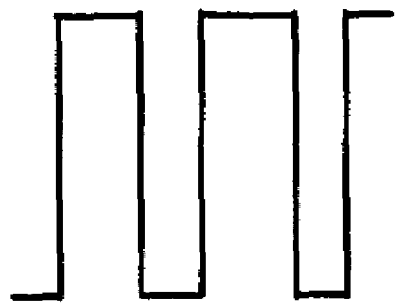
FIG. 3B OLN 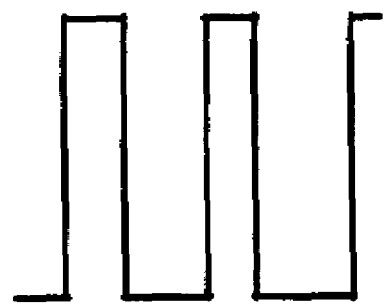
FIG. 3C ORP 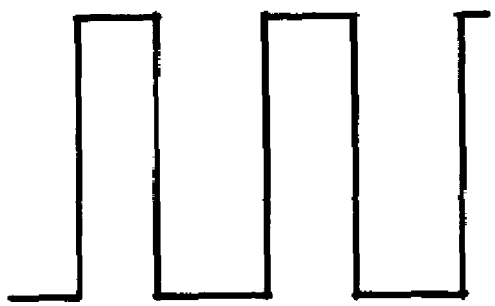
FIG. 3D ORN 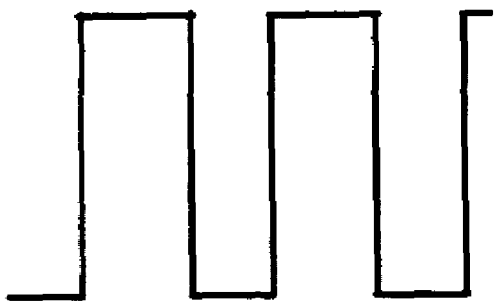

FIG. 4
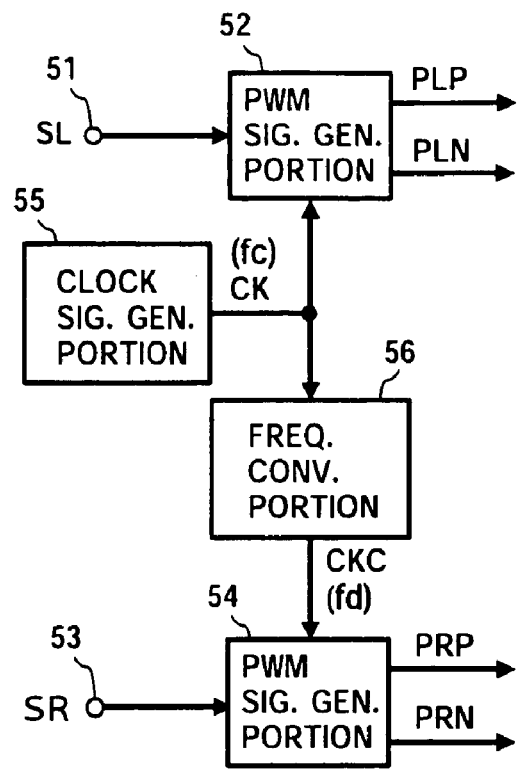
FIG. 5A  PLP
FIG. 5B  PLN
Tu  Tu
FIG. 5C  PRP
FIG. 5D  PRN
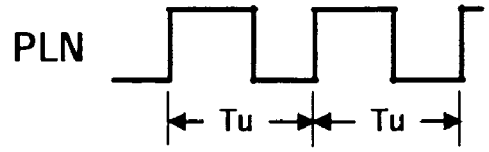
Tv  Tv

POWER AMPLIFICATION CIRCUITS

CROSS-REFERENCE TO RELATED APPLICATIONS

The present application claims priority from Japanese Application No. 2003-379394 filed Nov. 10, 2003, the disclosure of which is hereby incorporated by reference herein.

BACKGROUND OF THE INVENTION

The present invention relates generally to power amplification circuits, and more particularly, to an improvement in a circuit for performing a switching operation in response to pulse width modulation (hereinafter, referred to as PWM) signals based respectively on a plurality of audio signals or the like so as to cause the PWM signals to be subjected to power amplification, and then supplying circuit loads each including a speaker or the like with a plurality of output signals obtained with the power amplification.

In the field of acoustic apparatus operative to amplify an audio signal and supply a speaker with the amplified audio signal to obtain reproduced sound based on the audio signal, there have been proposed various systems for amplifying the audio signal in pursuit of the respective purposes assigned thereto. In particular, with respect to power amplification performed to obtain, based on an input audio signal, an output audio signal used for driving a speaker, a D-class amplification which is carried out by an active amplifying element, such as a transistor, functioning in the manner of D-class operation, is often adopted because a relatively superior distortion characteristic can be obtained thereby.

D-class amplification is generally performed with a switching operation of an active amplifying element, for example, a transistor, in response to an input signal which is an audio signal or the like. In the case of a power amplification circuit which performs D-class amplification for audio signals, there previously has been proposed such a circuit that is operable first to produce a PWM signal based on an input audio signal, then to cause the PWM signal to be subjected to power amplification and to supply a speaker portion with the amplified PWM signal through a low pass filter (hereinafter, referred to as LPF), as disclosed in, for example, Japanese patent application published before examination under publication number 2002-158544.

The power amplification circuit previously proposed is configured to be a so-called Balanced Transformerless (hereinafter, referred to as BTL) type, namely, a power amplification circuit in which a couple of switching amplifier portions are provided for driving a speaker portion connected in common to the switching amplifier portions. In such a power amplification circuit, a pulse width modulation amplifier is provided for producing first and second PWM signals having complementary variations in the respective pulse widths caused in response to a digital signal in an audio frequency band as the input audio signal. The first PWM signal obtained from the pulse width modulation amplifier is subjected to power amplification carried out with the switching operation of a first power switching circuit (a first switching amplifier portion) performed in response to the first PWM signal, and a first PWM power signal which is obtained as an output signal of the first power switching circuit is supplied to a first power LPF. The second PWM signal obtained from the pulse width modulation amplifier is subjected to power amplification carried out with the switching operation of a second power switching circuit (a second switching amplifier portion) performed in response to the second PWM signal, and a second PWM power signal which is obtained as an output signal of the second power switching circuit is supplied to a second power LPF.

Then, a couple of signals derived, respectively, from the first and second power LPFs, which are opposite one another in polarity, are supplied to the speaker portion connected to both of the first and second power LPFs. As a result, the speaker portion is driven differentially with the signals opposite one another in polarity to reproduce sound in response to the input audio signal.

In the previously proposed power amplification circuit mentioned above, the first and second PWM signals obtained from the pulse width modulation amplifier based on the digital signal in the audio frequency band as the input audio signal are usually produced with the use of a common clock signal. Each of the first and second PWM signals produced with the use of the common clock signal has substantially the same carrier frequency corresponding to the frequency of the clock signal and therefore the first and second PWM signals have respective periods synchronized with one another. Then, a first switching operation is performed at every period of the first PWM signal in the first power switching circuit responsive to the first PWM signal and a second switching operation is performed at every period of the second PWM signal in the second power switching circuit responsive to the second PWM signal.

In each of the first and second power switching circuits, an overshooting or undershooting variation caused by ringing or the like appears on the rising or falling edge of the first or second PWM power signal whenever the switching operation is performed in response to the first or second PWM signal. The overshooting or undershooting variation thus appearing on the rising or falling edge of the first or second PWM power signal results in undesirable noise.

Since the switching operation of each of the first and second power switching circuits is performed at every period of one of the first and second PWM signals, the noise resulting from the switching operation of the first power switching circuit appears at every period which is the same as the period of the first PWM signal and the noise resulting from the switching operation of the second power switching circuit appears at every period which is the same as the period of the second PWM signal. Accordingly, the noise resulting from the switching operation of the first power switching circuit and the noise resulting from the switching operation of the second power switching circuit each contain a main frequency component, the frequency of which is the same as the carrier frequency of each of the first and second PWM signals.

The first and second power switching circuits constitute a switching amplifier operable to cause each of the first and second PWM signals to be subjected to power amplification. Although the switching amplifier thus configured is provided to be a single amplifier for an audio signal of a single channel in the case of a single-channel acoustic apparatus, a plurality of switching amplifiers are provided in parallel for a couple of stereophonic sound signals or three or more multi-channel sound signals in a multi-channel acoustic apparatus. In the case where a plurality of switching amplifiers are provided in parallel, each of the switching amplifiers generates noise containing a main frequency component having a frequency which is the same as the carrier frequency of each of the first and second PWM signals.

Under such circumstances, a plurality of pairs of the first and second PWM signals supplied to the plural switching amplifiers as input signals are usually produced with a common clock signal so as to have the same carrier frequency. Therefore, the noise generated by each of the switching amplifiers has a main frequency component which is substantially the same as the carrier frequency of each the first and second PWM signals. This means that the noise generated by each of the switching amplifiers is concentrated upon a particular relatively narrow frequency band and it is feared that the noise will grow to be so large as to be transmitted to the outside as unwanted radiation to disturb communications on the outside and further to exert a bad influence upon electronic apparatus used on the outside.

SUMMARY OF THE INVENTION

Accordingly, it is an object of the present invention to provide a power amplification circuit in which a plurality of PWM signals are produced in response to a plurality of input signals, such as audio signals, the PWM signals thus produced are subjected to power amplification carried out by a plurality of switching amplifiers, and a plurality of output signals obtained from the switching amplifiers are supplied respectively to a plurality of circuit loads each including at least a speaker portion, the power amplification circuit thereby avoiding the aforementioned disadvantages encountered with the prior art.

Another object of the present invention is to provide a power amplification circuit in which a plurality of PWM signals are produced in response to a plurality of input signals, such as audio signals, the PWM signals thus produced are subjected to power amplification carried out by a plurality of switching amplifiers, and a plurality of output signals obtained from the switching amplifiers are supplied respectively to a plurality of circuit loads each including at least a speaker portion, the power amplification circuit thereby preventing noise generated in each of the switching amplifiers from concentrating upon a particular relatively narrow frequency band.

A further object of the present invention is to provide a power amplification circuit in which a plurality of PWM signals are produced in response to a plurality of input signals, such as audio signals, the PWM signals thus produced are subjected to power amplification carried out by a plurality of switching amplifiers, and a plurality of output signals obtained from the switching amplifiers are supplied respectively to a plurality of circuit loads each including at least a speaker portion, the power amplification circuit thereby preventing noise generated in each of the switching amplifiers from concentrating upon a particular relatively narrow frequency band, so that interference toward communications exchanged on the outside or bad influence upon electronic apparatus used on the outside which results from the noise generated in each of the switching amplifiers can be effectively restrained.

According to the present invention, there is provided a power amplification circuit which includes a first clock signal generating portion operable to produce a first clock signal having a first frequency; a second clock signal generating portion operable to produce a second clock signal having a second frequency different from the first frequency; a first PWM signal generating portion operable to produce from a first input signal a first PWM signal using the first clock signal; a second PWM signal generating portion operable to produce from a second input signal a second PWM signal using the second clock signal; a first switching amplifier operable to perform a switching operation in response to the first PWM signal to subject the first PWM signal to power amplification to produce a first output signal, and to supply the first output signal to a first circuit load; and a second switching amplifier operable to perform a switching operation in response to the second PWM signal to subject the second PWM signal to power amplification to produce a second output signal, and to supply the second output signal to a second circuit load.

In the power amplification circuit thus constituted in accordance with the present invention, when the first and second clock signals having, respectively, first and second frequencies different from each other, are supplied to the first and second PWM signal generating portions from the first and second clock signal generating portions, the first PWM signal generating portion produces from the first input signal the first PWM signal using the first clock signal and the second PWM signal generating portion produces from the second input signal the second PWM signal using the second clock signal. Then, the first switching amplifier performs a switching operation in response to the first PWM signal to subject the first PWM signal to power amplification to produce a first output signal and supplies the first output signal to the first circuit load, and the second switching amplifier performs a switching operation in response to the second PWM signal to subject the second PWM signal to power amplification to produce a second output signal and supplies the second output signal to the second circuit load.

The switching operation of the first switching amplifier is performed at every period of the first PWM signal so that noise generated with the switching operation of the first switching amplifier includes a main frequency component having a frequency which is the same as the carrier frequency of the first PWM signal. Similarly, the switching operation of the second switching amplifier is performed at every period of the second PWM signal so that noise generated with the switching operation of the second switching amplifier includes a main frequency component having a frequency which is the same as the carrier frequency of the second PWM signal.

The first PWM signal is produced using a first clock signal having a first frequency so as to have a carrier frequency based on the first frequency of the first clock signal, and the second PWM signal is produced using a second clock signal having a second frequency different from the first frequency so as to have a carrier frequency based on the second frequency of the second clock signal which is different from the carrier frequency of the first PWM signal. Therefore, the noise generated with the switching operation performed in the first switching amplifier and the noise generated with the switching operation performed in the second switching amplifier are different from each other in the frequency of each of their main frequency components, so that the noise thus generated in each of the first and second switching amplifiers is prevented from concentrating upon a particular relatively narrow frequency band.

Accordingly, with the power amplification circuit according to the present invention, the noise generated with the switching operation performed in the first switching amplifier in response to the first PWM signal and the noise generated with the switching operation performed in the second switching amplifier in response to the second PWM signal are prevented from concentrating upon any particular relatively narrow frequency band, and consequently, interference toward communications exchanged on the outside or bad influence upon electronic apparatus used on the outside which results from the noise generated in each of the first and second switching amplifiers can be effectively restrained.

The above and other objects, features and advantages of the present invention will become apparent from the following detailed description taken in conjunction with the accompanying drawings.

BRIEF DESCRIPTION OF THE DRAWINGS

FIGS. 2A to 2D are signal waveform diagrams used for explaining the operation of the embodiment shown in FIG. 1;

FIGS. 3A to 3D are signal waveform diagrams used for explaining the operation of the embodiment shown in FIG. 1;

FIG. 4 is a schematic circuit diagram showing a part of another embodiment of a power amplification circuit according to the present invention; and FIGS. 5A to 5D are signal waveform diagrams used for explaining the operation of the part of the embodiment shown in FIG. 4.

DETAILED DESCRIPTION

Figure 1:
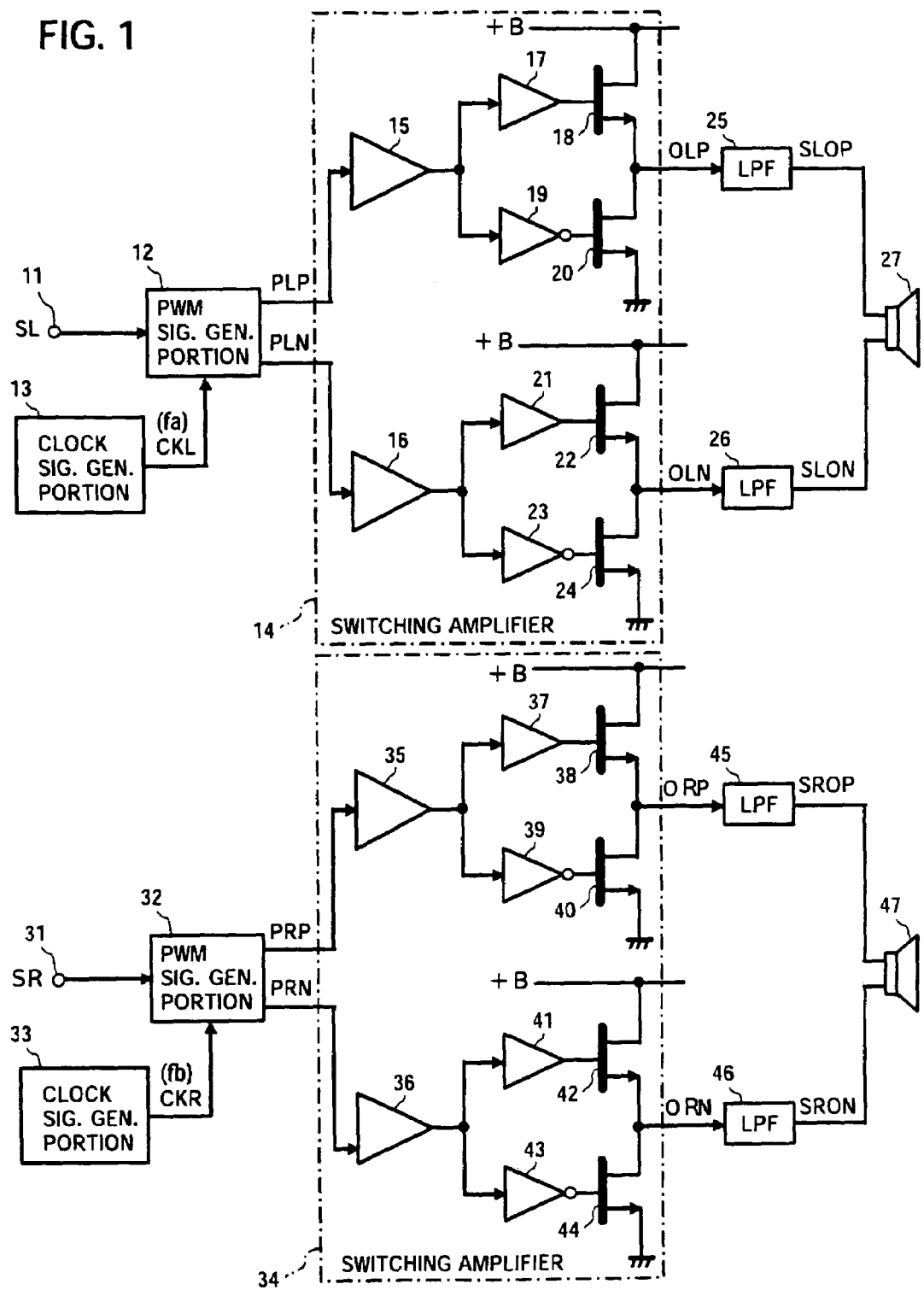
FIG. 1 is a schematic circuit diagram showing an embodiment of a power amplification circuit according to the present invention.

FIG. 1 shows a first embodiment of a power amplification circuit according to the present invention. The first embodiment shown in FIG. 1 is applied for carrying out signal processing including power amplification for two-channel signals, such as left and right sound signals constituting a stereophonic audio signal.

Referring to FIG. 1, for example, a left sound signal SL which, together with a right sound signal SR, forms a stereophonic audio signal, is supplied through an input terminal 11 to a PWM signal generating portion 12 as an input signal. A clock signal CKL obtained from a clock signal generating portion 13 is also supplied to the PWM signal generating portion 12. The clock signal CKL is selected to have a frequency fa of about 50 MHz, for example.

The PWM signal generating portion 12 produces, by the use of the clock signal CKL, a pair of PWM signals PLP and PLN. Signals PLP and PLN have complementary variations in their respective pulse widths caused in response to the left sound signal SL, as shown in FIGS. 2A and 2B. (That is, signals PLP and PLN are contrary to one another in variations in their respective pulse widths caused in response to the left sound signal SL.) In the relation between the PWM signals PLP and PLN, the pulse width of the PWM signal PLN decreases in response to the left sound signal SL when the pulse width of the PWM signal PLP increases in response to the left sound signal SL, and the pulse width of the PWM signal PLN increases in response to the left sound signal SL when the pulse width of the PWM signal PLP decreases in response to the left sound signal SL.

Each of the PWM signals PLP and PLN produced by the use of the clock signal CKL as described above and derived from the PWM signal generating portion 12 has a carrier frequency fp corresponding to the frequency fa of the clock signal CKL and a period Tp represented by 1/fp.

The PWM signals PLP and PLN are supplied to a switching amplifier 14. In the switching amplifier 14, the PWM signal PLP is supplied to a buffer amplifier portion 15 and the PWM signal PLN is supplied to a buffer amplifier portion 16.

The PWM signal PLP amplified in the buffer amplifier portion 15 is supplied through an amplifier 17, which is operable not to cause the PWM signal PLP to be subjected to an inversion in polarity, to the gate of a field effect transistor (hereinafter, referred to as FET) 18, and supplied also through an amplifier 19, which is operable to cause the PWM signal PLP to be subjected to an inversion in polarity, to the gate of an FET 20. The drain of the FET 18 is connected to a power supplying line +B, the source of the FET 18 is connected to the drain of the FET 20 and the source of the FET 20 is grounded. Each of the FETs 18 and 20 is operable to function as a switching element and the FETs 18 and 20 constitute, together with other parts, a power amplifier portion which is operable to cause the PWM signal PLP supplied thereto to be subjected to power amplification.

The FET 18 is operable to perform a switching operation (ON to OFF or OFF to ON) in response to each of the rising and falling edges of the PWM signal PLP which has passed through the amplifier 17 so as not to be subjected to an inversion in polarity and the FET 20 is operable to perform another switching operation (ON to OFF or OFF to ON) in response to each of the rising and falling edges of the PWM signal PLP which has passed through the amplifier 19 so as to be subjected to an inversion in polarity. With such switching operation of each of the FETs 18 and 20, the PWM signal PLP is subjected to power amplification and an output signal OLP is obtained at a connecting point between the source of the FET 18 and the drain of the FET 20, as shown in FIG. 3A.

The PWM signal PLN amplified in the buffer amplifier portion 16 is supplied through an amplifier 21, which is operable not to cause the PWM signal PLN to be subjected to an inversion in polarity, to the gate of an FET 22 and supplied also through an amplifier 23, which is operable to cause the PWM signal PLN to be subjected to an inversion in polarity, to the gate of an FET 24. The drain of the FET 22 is connected to a power supplying line +B, the source of the FET 22 is connected to the drain of the FET 24 and the source of the FET 24 is grounded. Each of the FETs 22 and 24 is operable to function as a switching element and the FETs 18 and 20 constitute, together with other parts, a power amplifier portion which is operable to cause the PWM signal PLN supplied thereto to be subjected to power amplification.

The FET 22 is operable to perform a switching operation (ON to OFF or OFF to ON) in response to each of the rising and falling edges of the PWM signal PLN which has passed through the amplifier 21 so as not to be subjected to an inversion in polarity and the FET 24 is operable to perform another switching operation (ON to OFF or OFF to ON) in response to each of the rising and falling edges of the PWM signal PLN which has passed through the amplifier 23 so as to be subjected to an inversion in polarity. With such switching operation of each of the FETs 22 and 24, the PWM signal PLN is subjected to power amplification and an output signal OLN is obtained at a connecting point between the source of the FET 22 and the drain of the FET 24, as shown in FIG. 3B.

In the power amplifier portion comprising the FETs 18 and 20, noise resulting from the switching operation of each of the FETs 18 and 20 is generated when the PWM signal PLP is subjected to power amplification to produce the output signal OLP. Each of the FETs 18 and 20 performs the switching operation in response to each of the rising and falling edges of the PWM signal PLP, and therefore the noise resulting from the switching operation of each of the FETs 18 and 20 is generated at every point of time at which the rising or falling edge of the PWM signal PLP appears. Consequently, the noise resulting from the switching operation of each of the FETs 18 and 20 performed in response to the PWM signal PLP in the switching amplifier 14 contains a main component generated to have a period which is the same as the period Tp of the PWM signal PLP. This means that the noise resulting from the switching operation of each of the FETs 18 and 20 in the switching amplifier 14 contains a main frequency component having a frequency which is the same as the carrier frequency fp of the PWM signal PLP.

Similarly, in the power amplifier portion comprising the FETs 22 and 24, noise resulting from the switching operation of each of the FETs 22 and 24 is generated when the PWM signal PLN is subjected to power amplification to produce the output signal OLN. Each of the FETs 22 and 24 performs the switching operation in response to each of the rising and falling edges of the PWM signal PLN, and therefore the noise resulting from the switching operation of each of the FETs 22 and 24 is generated at every point of time at which the rising or falling edge of the PWM signal PLN appears. Consequently, the noise resulting from the switching operation of each of the FETs 22 and 24 performed in response to the PWM signal PLN in the switching amplifier 14 contains a main component generated to have a period which is the same as the period Tp of the PWM signal PLN. This means that the noise resulting from the switching operation of each of the FETs 22 and 24 in the switching amplifier 14 contains a main frequency component having a frequency which is the same as the carrier frequency fp of the PWM signal PLN.

As described above, the noise resulting from the switching operation of each of the FETs 18, 20, 22 and 24 constituting the power amplifier portion, which is performed in response to the PWM signals PLP and PLN in the switching amplifier 14, contains a main frequency component having a frequency which is the same as the carrier frequency fp of each of the PWM signals PLP and PLN.

The output signal OLP obtained at the connecting point between the source of the FET 18 and the drain of the FET 20 in the switching amplifier 14 is supplied to an LPF 25 and an analog signal SLOP varying in level in response to the output signal OLP is derived from the LPF 25. The output signal OLN obtained at the connecting point between the source of the FET 22 and the drain of the FET 24 in the switching amplifier 14 is supplied to an LPF 26 and an analog signal SLON varying in level in response to the output signal OLN is derived from the LPF 26.

The analog signals SLOP and SLON derived from the LPFs 25 and 26, respectively, are supplied to a speaker portion 27 as a power-amplified audio signal based on the left sound signal SL which is supplied through the input terminal 11 to the PWM signal generating portion 12 as the input signal. Consequently, the speaker portion 27 is driven with the analog signals SLOP and SLON combined with each other therein to reproduce sound in response to the left sound signal SL as the input signal.

In such a structure as mentioned above, the LPFs 25 and 26 and the speaker portion 27 constitute a circuit load provided in common to the power amplifier portion comprising the FETs 18 and 20 and the power amplifier portion comprising the FETs 22 and 24 in the switching amplifier 14. Further, the speaker portion 27 constitutes a terminal load portion.

Further, in the first embodiment shown in FIG. 1, for example, the right sound signal SR which, together with the left sound signal SL, forms the stereophonic audio signal, is supplied through an input terminal 31 to a PWM signal generating portion 32 as an input signal. A clock signal CKR obtained from a clock signal generating portion 33 is also supplied to the PWM signal generating portion 32. The clock signal CKR is selected to have a frequency fb different from the frequency fa of the clock signal CKL obtained from the clock signal generating portion 13. The frequency fb of the clock signal CKR is set to be lower than the frequency fa of the clock signal CKL, for example.

The PWM signal generating portion 32 produces, by the use of the clock signal CKR, a pair of PWM signals PRP and PRN. Signals PRP and PRN have complementary variations in their respective pulse widths caused in response to the right sound signal SR, as shown in FIGS. 2C and 2D. (That is, signals PRP and PRN are contrary to one another in variations in their respective pulse widths caused in response to the right sound signal SR.) In the relation between the PWM signals PRP and PRN, the pulse width of the PWM signal PRN decreases in response to the right sound signal SR when the pulse width of the PWM signal PRP increases in response to the right sound signal SR, and the pulse width of the PWM signal PRN increases in response to the right sound signal SR when the pulse width of the PWM signal PRP decreases in response to the right sound signal SR.

Each of the PWM signals PRP and PRN produced by the use of the clock signal CKR as described above and derived from the PWM signal generating portion 32 has a carrier frequency fq corresponding to the frequency fb of the clock signal CKR and a period Tq represented by 1/fq. The frequency fb of the clock signal CKR is selected, for example, to be lower than the frequency fa of the clock signal CKL, and in such a case, the carrier frequency fq of each of the PWM signals PRP and PRN is lower than the carrier frequency fp of each of the PWM signals PLP and PLN so that the period Tq=1/fq of each of the PWM signals PRP and PRN is longer than the period Tp=1/fp of each of the PWM signals PLP and PLN.

The PWM signals PRP and PRN are supplied to a switching amplifier 34. In the switching amplifier 34, the PWM signal PRP is supplied to a buffer amplifier portion 35 and the PWM signal PRN is supplied to a buffer amplifier portion 36.

The PWM signal PRP amplified in the buffer amplifier portion 35 is supplied through an amplifier 37, which is operable not to cause the PWM signal PRP to be subjected to an inversion in polarity, to the gate of an FET 38, and supplied also through an amplifier 39 which is operable to cause the PWM signal PRP to be subjected to an inversion in polarity, to the gate of an FET 40. The drain of the FET 38 is connected to a power supplying line +B, the source of the FET 38 is connected to the drain of the FET 40 and the source of the FET 40 is grounded. Each of the FETs 38 and 40 is operable to function as a switching element and the FETs 38 and 40 constitute, together with other parts, a power amplifier portion which is operable to cause the PWM signal PRP supplied thereto to be subjected to power amplification.

The FET 38 is operable to perform a switching operation (ON to OFF or OFF to ON) in response to each of the rising and falling edges of the PWM signal PRP which has passed through the amplifier 37 so as not to be subjected to an inversion in polarity and the FET 40 is operable to perform another switching operation (ON to OFF or OFF to ON) in response to each of the rising and falling edges of the PWM signal PRP which has passed through the amplifier 39 so as to be subjected to an inversion in polarity. With such switching operation of each of the FETs 38 and 40, the PWM signal PRP is subjected to power amplification and an output signal ORP is obtained at a connecting point between the source of the FET 38 and the drain of the FET 40, as shown in FIG. 3C.

The PWM signal PRN amplified in the buffer amplifier portion 36 is supplied through an amplifier 41, which is operable not to cause the PWM signal PRN to be subjected to an inversion in polarity, to the gate of an FET 42, and supplied also through an amplifier 43, which is operable to cause the PWM signal PRN to be subjected to an inversion in polarity, to the gate of an FET 44. The drain of the FET 42 is connected to a power supplying line +B, the source of the FET 42 is connected to the drain of the FET 44 and the source of the FET 44 is grounded. Each of the FETs 42 and 44 is operable to function as a switching element and the FETs 42 and 44 constitute, together with other parts, a power amplifier portion which is operable to cause the PWM signal PRN supplied thereto to be subjected to power amplification.

The FET 42 is operable to perform a switching operation (ON to OFF or OFF to ON) in response to each of the rising and falling edges of the PWM signal PRN which has passed through the amplifier 41 so as not to be subjected to an inversion in polarity and the FET 44 is operable to perform another switching operation (ON to OFF or OFF to ON) in response to each of the rising and falling edges of the PWM signal PRN which has passed through the amplifier 43 so as to be subjected to an inversion in polarity. With such switching operation of each of the FETs 42 and 44, the PWM signal PRN is subjected to power amplification and an output signal ORN is obtained at a connecting point between the source of the FET 42 and the drain of the FET 44, as shown in FIG. 3D.

In the power amplifier portion comprising the FETs 38 and 40, noise resulting from the switching operation of each of the FETs 38 and 40 is generated when the PWM signal PRP is subjected to power amplification to produce the output signal ORP. Each of the FETs 38 and 40 performs the switching operation in response to each of the rising and falling edges of the PWM signal PRP, and therefore the noise resulting from the switching operation of each of the FETs 38 and 40 is generated at every point of time at which the rising or falling edge of the PWM signal PRP appears. Consequently, the noise resulting from the switching operation of each of the FETs 38 and 40 performed in response to the PWM signal PRP in the switching amplifier 34 contains a main component generated to have a period which is the same as the period Tq of the PWM signal PRP. This means that the noise resulting from the switching operation of each of the FETs 38 and 40 in the switching amplifier 34 contains a main frequency component having a frequency which is the same as the carrier frequency fq of the PWM signal PRP.

Similarly, in the power amplifier portion comprising the FETs 42 and 44, noise resulting from the switching operation of each of the FETs 42 and 44 is generated when the PWM signal PRN is subjected to power amplification to produce the output signal ORN. Each of the FETs 42 and 44 performs the switching operation in response to each of the rising and falling edges of the PWM signal PRN, and therefore the noise resulting from the switching operation of each of the FETs 42 and 44 is generated at every point of time at which the rising or falling edge of the PWM signal PRN appears. Consequently, the noise resulting from the switching operation of each of the FETs 42 and 44 performed in response to the PWM signal PRN in the switching amplifier 34 contains a main component generated to have a period which is the same as the period Tq of the PWM signal PRN. This means that the noise resulting from the switching operation of each of the FETs 42 and 44 in the switching amplifier 34 contains a main frequency component having a frequency which is the same as the carrier frequency fq of the PWM signal PRN.

As described above, the noise resulting from the switching operation of each of the FETs 38, 40, 42 and 44 constituting the power amplifier portion, which is performed in response to the PWM signals PRP and PRN in the switching amplifier 34, contains a main frequency component having a frequency which is the same as the carrier frequency fq of each of the PWM signals PRP and PRN.

The noise resulting from the switching operation of each of the FETs 38, 40, 42 and 44 performed in response to the PWM signals PRP and PRN in the switching amplifier 34 is generated substantially in the same manner as the noise resulting from the switching operation of each of the FETs 18, 20, 22 and 24 performed in response to the PWM signals PLP and PLN in the switching amplifier 14. However, although the noise resulting from the switching operation of each of the FETs 18, 20, 22 and 24 contains a main frequency component having a frequency which is the same as the carrier frequency fp of each of the PWM signals PLP and PLN, the noise resulting from the switching operation of each of the FETs 38, 40, 42 and 44 contains a main frequency component having a frequency which is the same as the carrier frequency fq of each of the PWM signals PRP and PRN and different from (for example, lower than) the carrier frequency fp of each of the PWM signals PLP and PLN.

That is, the noise resulting from the switching operation of each of the FETs 18, 20, 22 and 24 and the noise resulting from the switching operation of each of the FETs 38, 40, 42 and 44 are different from each other in the frequency of each of their respective main frequency components. The frequency of one of the main frequency components is the same as the carrier frequency fp of each of the PWM signals PLP and PLN and the frequency of the other of the main frequency components is the same as the carrier frequency fq of each of the PWM signals PRP and PRN. Accordingly, the main frequency component of the noise resulting from the switching operation of each of the FETs 18, 20, 22 and 24 and the main frequency component of the noise resulting from the switching operation of each of the FETs 38, 40, 42 and 44 are different in frequency from each other and therefore the noise resulting from the switching operation of each of the FETs 18, 20, 22 and 24 and the noise resulting from the switching operation of each of the FETs 38, 40, 42 and 44 do not concentrate upon a particular relatively narrow frequency band.

As a result, the noise resulting from the switching operation of each of the FETs 18, 20, 22 and 24 performed in response to the PWM signals PLP and PLN in the switching amplifier 14 and the noise resulting from the switching operation of each of the FETs 38, 40, 42 and 44 performed in response to the PWM signals PRP and PRN in the switching amplifier 34 are prevented from concentrating upon any particular relatively narrow frequency band, and consequently, interference toward communications exchanged in the outside or bad influence upon electronic apparatus used in the outside which result from the noise generated in each of the switching amplifiers 14 and 34 can be effectively restrained.

The output signal ORP obtained at the connecting point between the source of the FET 38 and the drain of the FET 40 in the switching amplifier 34 is supplied to an LPF 45 and an analog signal SROP varying in level in response to the output signal ORP is derived from the LPF 45. The output signal ORN obtained at the connecting point between the source of the FET 42 and the drain of the FET 44 in the switching amplifier 34 is supplied to an LPF 46 and an analog signal SRON varying in level in response to the output signal ORN is derived from the LPF 46.

The analog signals SROP and SRON derived from the LPFs 45 and 46, respectively, are supplied to a speaker portion 47 as a power-amplified audio signal based on the right sound signal SR which is supplied through the input terminal 31 to the PWM signal generating portion 32 as the input signal. Consequently, the speaker portion 47 is driven with the analog signals SROP and SRON combined with each other therein to reproduce sound in response to the right sound signal SR as the input signal.

In such a structure as mentioned above, the LPFs 45 and 46 and the speaker portion 47 constitute a circuit load provided in common to the power amplifier portion comprising the FETs 38 and 40 and the power amplifier portion comprising the FETs 42 and 44 in the switching amplifier 34. Further, the speaker portion 47 constitutes a terminal load portion.

FIG. 4 shows a part of a second embodiment of a power amplification circuit according to the present invention. The second embodiment shown in FIG. 4 is also applied to carry out signal processing including power amplification for two-channel signals, such as left and right sound signals constituting a stereophonic audio signal.

In the second embodiment, the part of which is shown in FIG. 4, various portions other than the portion corresponding to the portion of the first embodiment shown in FIG. 1, in which the input terminals 11 and 31, the PWM signal generating portions 12 and 32 and the clock signal generating portions 13 and 33 are provided, are constituted substantially in the same manner as those of the first embodiment shown in FIG. 1. Such various portions of the second embodiment are omitted from FIG. 4. Accordingly, the portion of the second embodiment shown in FIG. 4 is to be used in place of the portion of the first embodiment shown in FIG. 1, in which the input terminals 11 and 31, the PWM signal generating portions 12 and 32 and the clock signal generating portions 13 and 33 are provided.

In the portion of the second embodiment shown in FIG. 4, for example, a left sound signal SL which, together with a right sound signal SR, forms a stereophonic audio signal, is supplied through an input terminal 51 to a PWM signal generating portion 52 as an input signal. Further, a right sound signal SR which, together with the left sound signal SL, forms the stereophonic audio signal, is supplied through an input terminal 53 to a PWM signal generating portion 54 as an input signal.

The PWM signal generating portion 52 is also supplied with a clock signal CK obtained from a clock signal generating portion 55. The clock signal CK is selected to have a frequency fc set to be about 50 MHz, for example.

The clock signal CK obtained from the clock signal generating portion 55 is further supplied to a frequency converting portion 56. The frequency converting portion 56 is operable to cause the clock signal CK obtained from the clock signal generating portion 55 to be subjected to frequency-conversion to produce a clock signal CKC based on the clock signal CK having a frequency fd which is different from the frequency fc, and then to supply the PWM signal generating portion 54 with the clock signal CKC.

The frequency converting portion 56 comprises, for example, a frequency-multiplier for multiplying (for example, doubling) the frequency fc of the clock signal CK obtained from the clock signal generating portion 55. In such a case, the frequency fd of the clock signal CKC obtained from the frequency converting portion 56 corresponds to double the frequency fc of the clock signal CK obtained from the clock signal generating portion 55, namely, fd=2×fc.

The PWM signal generating portion 52 produces, by the use of the clock signal CK, a pair of PWM signals PLP and PLN. Signals PLP and PLN have complementary variations in their respective pulse widths caused in response to the left sound signal SL, as shown in FIGS. 5A and 5B. (That is, signals PLP and PLN are contrary to one another in variations in their respective pulse widths caused in response to the left sound signal SL.) In the relation between the PWM signals PLP and PLN, the pulse width of the PWM signal PLN decreases in response to the left sound signal SL when the pulse width of the PWM signal PLP increases in response to the left sound signal SL, and the pulse width of the PWM signal PLN increases in response to the left sound signal SL when the pulse width of the PWM signal PLP decreases in response to the left sound signal SL.

Each of the PWM signals PLP and PLN thus produced by the use of the clock signal CK and derived from the PWM signal generating portion 52 has a carrier frequency fu corresponding to the frequency fc of the clock signal CK and a period Tu represented by 1/fu.

Meanwhile, the PWM signal generating portion 54 produces, by the use of the clock signal CKC, a pair of PWM signals PRP and PRN. Signals PRP and PRN have complementary variations in their respective pulse widths caused in response to the right sound signal SR, as shown in FIGS. 5C and 5D. (That is, signals PRP and PRN are contrary to one another in variations in their respective pulse widths caused in response to the right sound signal SR.) In the relation between the PWM signals PRP and PRN, the pulse width of the PWM signal PRN decreases in response to the right sound signal SR when the pulse width of the PWM signal PRP increases in response to the right sound signal SR, and the pulse width of the PWM signal PRN increases in response to the right sound signal SR when the pulse width of the PWM signal PRP decreases in response to the right sound signal SR.

Each of the PWM signals PRP and PRN thus produced by the use of the clock signal CKC and derived from the PWM signal generating portion 54 has a carrier frequency fv corresponding to the frequency fd of the clock signal CKC and a period Tv represented by 1/fv. Since the frequency fd of the clock signal CKC is different from the frequency fc of the clock signal CK (for example, double the frequency fc (2×fc)), the carrier frequency fv of each of the PWM signals PRP and PRN is different from the carrier frequency fu of each of the PWM signals PLP and PLN (for example, double the carrier frequency fu (2×fu)), and therefore the period Tv=1/fv of each of the PWM signals PRP and PRN is different from the period Tu=1/fu of each of the PWM signals PLP and PLN (for example, half of the period Tu (½×Tu)).

The PWM signals PLP and PLN obtained from the PWM signal generating portion 52 are supplied to a switching amplifier corresponding to the switching amplifier 14 provided in the first embodiment shown in FIG. 1 and the PWM signals PRP and PRN obtained from the PWM signal generating portion 54 are supplied to a switching amplifier corresponding to the switching amplifier 34 provided in the first embodiment shown in FIG. 1.

The second embodiment having the part thereof shown in FIG. 4 operates substantially in the same manner as the first embodiment shown in FIG. 1 and the effect and advantages obtained with the first embodiment shown can be obtained also with the second embodiment.

Although the switching amplifier 14 comprises the FETs 18, 20, 22 and 24, each of which functions as a switching element and constitutes a couple of power amplifier portions, and the switching amplifier 34 comprises the FETs 38, 40, 42 and 44, each of which functions as a switching element and constitutes a couple of power amplifier portions, in the first embodiment shown in FIG. 1, it should be understood that switching elements other than the FETs 18, 20, 22, 24, 38, 40, 42 and 44, for example, a plurality of bipolar transistors, can be used to constitute the switching amplifiers in place of the whole or part of the FETs 18, 20, 22, 24, 38, 40, 42 and 44.

Further, the power amplification circuit according to the present invention can be applied not only to power amplifier portions in multi-channel audio apparatus as shown in FIG. 1, but also to power amplifier portions in various electronic apparatus other than the audio apparatus.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A power amplification circuit, comprising;
a first clock signal generating portion operable to produce a first clock signal having a first frequency;
a second clock signal generating portion operable to produce a second clock signal having a second frequency different from the first frequency;
a first pulse width modulation signal generating portion operable to produce from a first input signal a first pulse width modulation signal using the first clock signal;
a second pulse width modulation signal generating portion operable to produce from a second input signal a second pulse width modulation signal using the second clock signal;
a first switching amplifier operable to perform a switching operation in response to the first pulse width modulation signal to subject the first pulse width modulation signal to power amplification to produce a first output signal, and to supply the first output signal to a first circuit load; and
a second switching amplifier operable to perform a switching operation in response to the second pulse width modulation signal to subject the second pulse width modulation signal to power amplification to produce a second output signal, and to supply the second output signal to a second circuit load.

2. A power amplification circuit according to claim 1, wherein the first circuit load includes a first low pass filter portion to which the first output signal is supplied and a first terminal load portion to which a signal obtained from the first low pass filter portion is supplied, and the second circuit load includes a second low pass filter portion to which the second output signal is supplied and a second terminal load portion to which a signal obtained from the second low pass filter is supplied.

3. A power amplification circuit according to claim 2, wherein the first and second input signals are audio signals and each of the first and second terminal load portions includes a speaker connected to one of the first and second low pass filter portions.

4. A power amplification circuit according to claim 1, wherein
the first pulse width modulation signal includes a first pair of pulse width modulation signals having complementary variations in their respective pulse widths,
the first switching amplifier performs switching operations in response to the first pair of pulse width modulation signals to subject each of the first pair of pulse width modulation signals separately to power amplification to produce a pair of output signals constituting the first output signal,
the second pulse width modulation signal includes a second pair of pulse width modulation signals having complementary variations in their respective pulse widths, and
the second switching amplifier performs switching operations in response to the second pair of pulse width modulation signals to subject each of the second pair of pulse width modulation signals separately to power amplification to produce a pair of output signals constituting the second output signal.

5. A power amplification circuit according to claim 4, wherein the first circuit load includes a first pair of low pass filters to which the pair of output signals constituting the first output signal are supplied and a first terminal load portion to which signals obtained from the first pair of low pass filters are supplied, and the second circuit load includes a second pair of low pass filters to which the pair of output signals constituting the second output signal are supplied and a second terminal portion to which signals obtained from the second pair of low pass filters are supplied.

6. A power amplification circuit according to claim 1, wherein the second clock signal generating portion includes a frequency converting portion operable to subject the first clock signal to frequency conversion to produce the second clock signal.

* * * * *